(12) United States Patent
Gaurav et al.

(10) Patent No.: US 8,978,002 B1
(45) Date of Patent: Mar. 10, 2015

(54) RAPID EXPRESSION COVERAGE

(71) Applicant: Mentor Graphics Corporation, Wilsonville, OR (US)

(72) Inventors: Verma Kumar Gaurav, San Jose, CA (US); Doug Warmke, Cupertino, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/013,925

(22) Filed: Aug. 29, 2013

(51) Int. Cl.
*G06F 17/50* (2006.01)

(52) U.S. Cl.
CPC .................................. *G06F 17/5081* (2013.01)
USPC .......................................................... 716/112

(58) Field of Classification Search
CPC . G06N 5/022; G06F 11/3676; G06F 17/5022; G06F 8/445; G06F 17/271; G06F 17/274
USPC ..................................... 716/100, 112; 703/16
See application file for complete search history.

(56) References Cited

U.S. PATENT DOCUMENTS

| | | | |
|---|---|---|---|
| 6,499,132 B1 * | 12/2002 | Morley et al. .................. | 716/103 |
| 6,675,138 B1 * | 1/2004 | Hollander et al. .............. | 703/13 |
| 6,691,079 B1 * | 2/2004 | Lai et al. ......................... | 703/16 |
| 6,920,583 B1 * | 7/2005 | Morley et al. ................... | 714/32 |
| 2010/0281350 A1 * | 11/2010 | Xie et al. ....................... | 714/811 |

* cited by examiner

*Primary Examiner* — Vuthe Siek
*Assistant Examiner* — Aric Lin

(57) ABSTRACT

This application discloses simulating a circuit design with a test bench and determining an expression coverage in the circuit design by the test bench with a rapid expression coverage process. The rapid expression coverage process can include dividing an expression in the circuit design into multiple sub-expressions, and separately evaluating each of the multiple sub-expressions during simulation of the circuit design to detect whether first operands in the corresponding sub-expressions receive each available input state, while second operands in the corresponding sub-expressions are in a non-masking state. The rapid expression coverage can generate an expression coverage metric to indicate whether expressions in the circuit design were covered by the test bench during the simulation of the circuit, for example, without having to generate truth-tables that include each possible input vector for each expression.

20 Claims, 8 Drawing Sheets

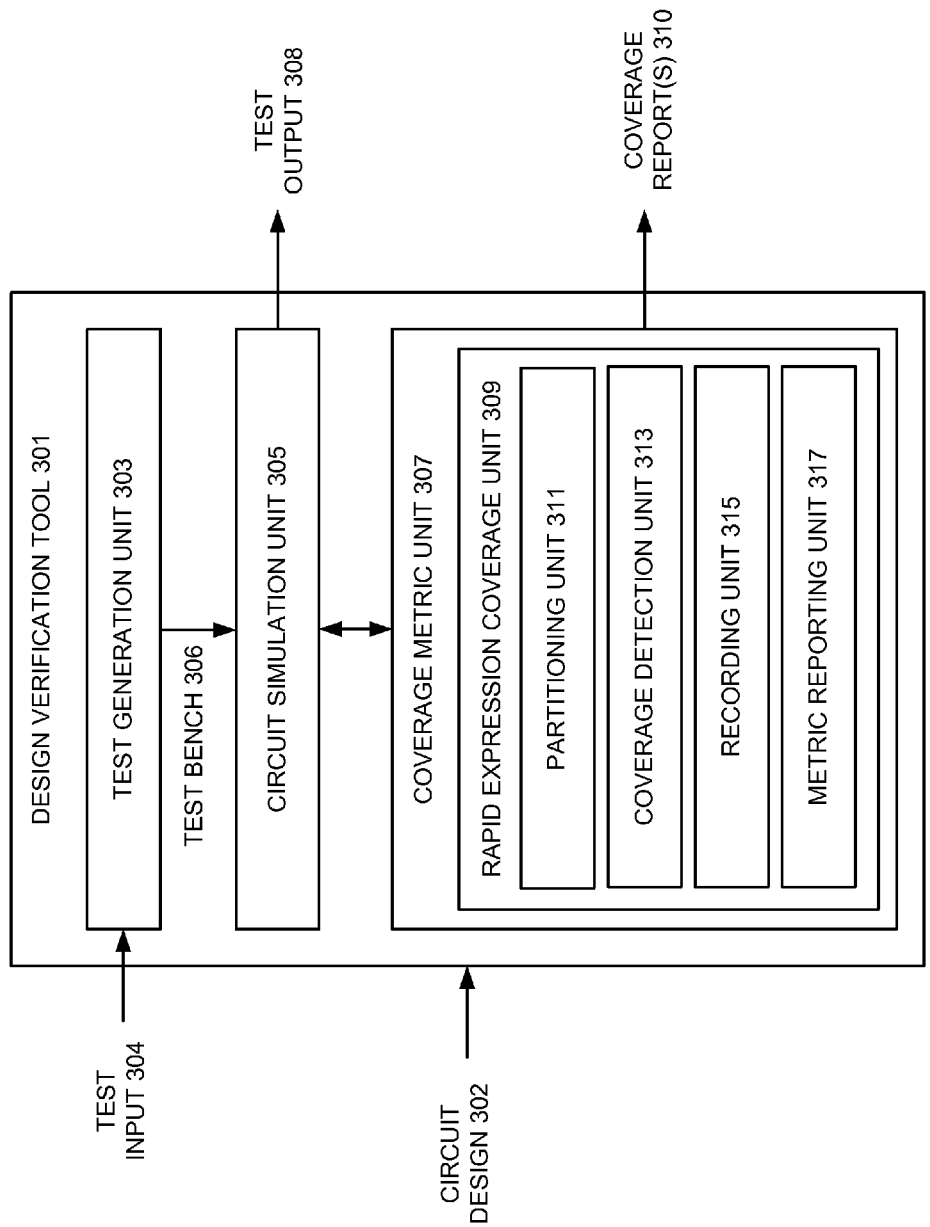

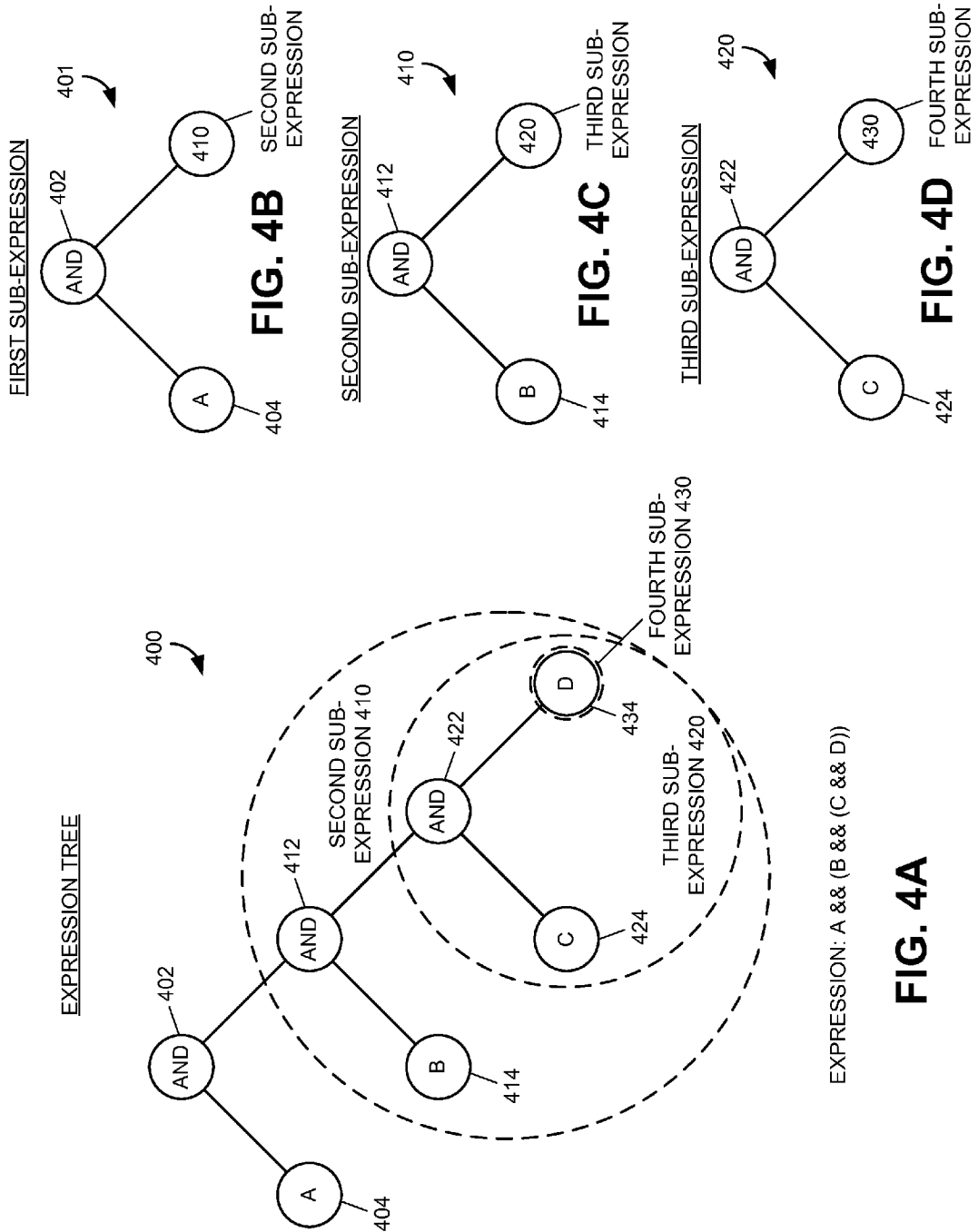

| SUB-EXPRESSION | FIRST OPERAND | SECOND OPERAND | FLAG SET |
|---|---|---|---|
| 1 | A | B && (C && D) = 1 | n/a |
| 2 | B | C && D = 1 | A = 1 |
| 3 | C | D = 1 | A = 1; B = 1 |
| 4 | D | none | A = 1; B = 1; C = 1 |

FIG. 4E

FIRST SUB-EXPRESSION 401

| INPUT | | | | FLAG | OUTPUT |
|---|---|---|---|---|---|
| A | B | C | D | F | A & B & C & D |
| 0 | 1 | 1 | 1 | 1 | 0 |
| 1 | 1 | 1 | 1 | 1 | 1 |

COVERAGE STATES — NON-MASKING STATE

SECOND SUB-EXPRESSION 410

| INPUT | | | FLAG | OUTPUT |
|---|---|---|---|---|
| A | B | C | D | F | A & B & C & D |
| 0 | 1 | 1 | 1 | 0 |
| 1 | 1 | 1 | 1 | 1 |

COVERAGE STATES — NON-MASKING STATE

THIRD SUB-EXPRESSION 420

| INPUT | | FLAG | OUTPUT |
|---|---|---|---|
| A | B | C | D | F | A & B & C & D |
| 0 | 1 | 1 | 0 |
| 1 | 1 | 1 | 1 |

COVERAGE STATES — NON-MASKING STATE

FOURTH SUB-EXPRESSION 430

| INPUT | FLAG | OUTPUT |
|---|---|---|
| A | B | C | D | F | A & B & C & D |
| 0 | 1 | 0 |
| 1 | 1 | 1 |

COVERAGE STATES

FIG. 4F

EXPRESSION: A || (B && (A || (C && D)))

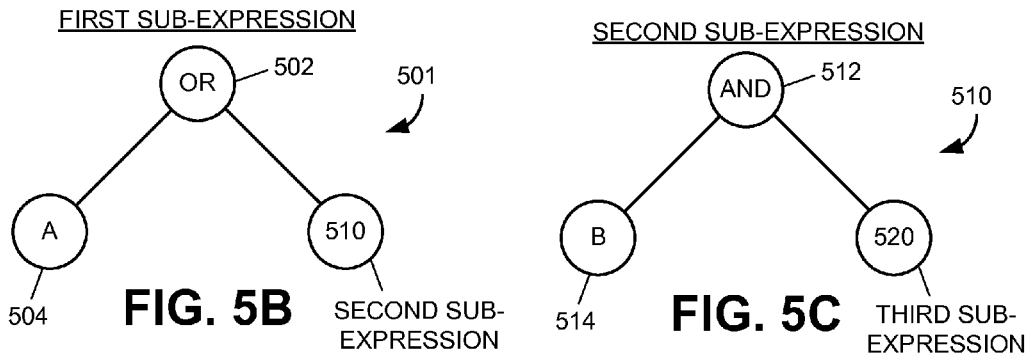
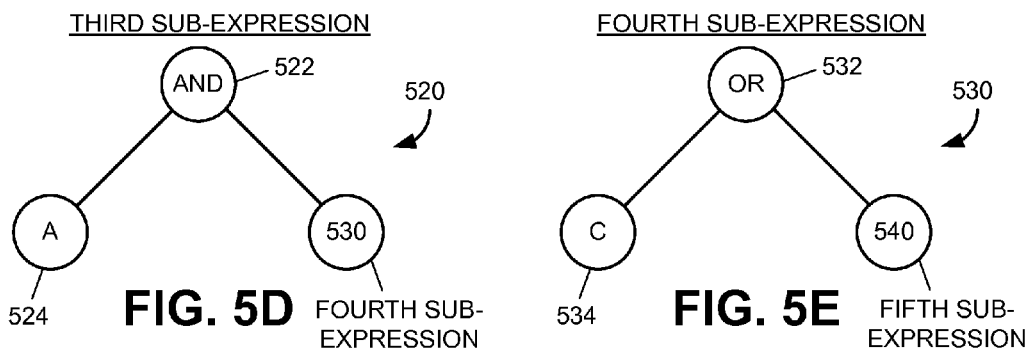
| SUB-EXPRESSION | COVERAGE OPERAND | NON-MAKSING OPERAND | FLAG SET |
|---|---|---|---|
| 1 | A | (B && (A \|\| (C && D)) = 0 | n/a |
| 2 | B | A \|\| (C && D) = 1 | A = 0 |
| 3 | A | C && D = 0 | A = 0; B = 1 |
| 4 | C | D = 1 | A = 0; B = 1 |
| 5 | D | none | A = 0; B = 1; C = 1 |
FIG. 5F

RAPID EXPRESSION COVERAGE

TECHNICAL FIELD

This application is generally related to electronic design automation and, more specifically, to rapid expression coverage during functional verification.

BACKGROUND

Microdevices, such as integrated microcircuits and microelectromechanical systems (MEMS), are used in a variety of products, from automobiles to microwaves to personal computers. Designing and fabricating microdevices typically involves many steps, known as a "design flow." The particular steps of a design flow often are dependent upon the type of microcircuit, its complexity, the design team, and the microdevice fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows for integrated microcircuits. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). As part of the creation of a logical design, a designer will also implement a place-and-route process to determine the placement of the various portions of the circuit, along with an initial routing of interconnections between those portions. The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices, such as transistors, resistors, and capacitors, which will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design can be again transformed, this time into a physical design that describes specific geometric elements. This type of design often is referred to as a "layout" design. The geometric elements, which typically are polygons, define the shapes that will be created in various materials to manufacture the circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Typically, a designer will perform a number of analyses on the resulting layout design data. For example, with integrated circuits, the layout design may be analyzed to confirm that it accurately represents the circuit devices and their relationships as described in the device design. The layout design also may be analyzed to confirm that it complies with various design requirements, such as minimum spacings between geometric elements. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes, that modify the layout design data to improve the usable resolution of the reticle or mask created from the design in a photolithographic manufacturing process.

After the layout design has been finalized, it is converted into a format that can be employed by a mask or reticle writing tool to create a mask or reticle for use in a photolithographic manufacturing process. The written masks or reticles then can be used in a photolithographic process to expose selected areas of a wafer to light or other radiation in order to produce the desired integrated microdevice structures on the wafer.

Returning to "functional verification," this type of analysis begins with a circuit design coded at a register transfer level (RTL), which can be simulated by a design verification tool. A designer, for example, utilizing the design verification tool, can generate a test bench that, when input to the simulated circuit design, can allow the design verification tool to analyze or verify the functionality of the simulated circuit design. Due to the complexity in many circuit designs, it is often impractical to perform functional verification utilizing test benches that cover every possible input vector for the simulated circuit design. Thus, many designers generate test benches having just a subset of the possible input vectors.

The design verification tool can quantify how well a test bench came to covering or adequately exercising the simulated circuit design, for example, with various coverage metrics. For example, the design verification tool can use a statement coverage metric to quantify whether each executable statement or line of code in the simulated circuit design was executed in response to the test bench. The design verification tool can use a decision coverage metric to quantify whether each coded decision path was utilized in response to the test bench. The design verification tool can use a condition coverage metric to quantify whether all outcomes of a condition, for example, both true and false, were realized in response to the test bench. The design verification tool can use an expression coverage metric to quantify whether expressions in the code of the circuit design, such as Boolean logic structures, were adequately exercised or functionally verified in response to the test bench. The design verification tool can, of course, incorporate many different coverage metrics, other than those discussed above.

In some cases, the design verification tool can cover an expression when the expression receives fewer than all of the possible input vectors defined by its available inputs. For example, the design verification tool can deem a two-input expression (A or B) completely covered when the expression receives three, (A,B)=(0,0), (0,1), and (1,0), of the four possible input vectors, (A,B)=(0,0), (0,1), (1,0), and (1,1), in response to a test bench, as the reception of input vectors (A,B)=(0,1) and (1,0) renders input vector (A,B)=(1,1) superfluous. To determine which of the possible input vectors may be excluded and still allow for complete coverage of each expression in the circuit design, conventionally the design verification tool generates truth-tables including all of the possible input vectors for each expression, and then selectively trims input vectors from the truth-tables in order to generate lists of input vectors that, if received, would completely cover each of the expressions. The design verification tool can utilize these lists of input vectors during simulation of the circuit design to identify whether the test bench includes adequate stimuli to completely cover each expression.

While analyzing the circuit design before simulation can identify truncated lists of input vectors that can completely cover each expression, the number of input vectors initially generated in the truth-tables varies exponentially ($2^N$) based on the number of inputs (N) in each expression. Many design verification tools endure long processing times and large memory requirements in order to initially generate these truth-tables and identify and store the truncated lists of input vectors for each expression in the circuit design.

SUMMARY

This application discloses tools and mechanisms for rapid expression coverage. According to various embodiments, the tools and mechanisms can simulate a circuit design with a test bench and determine expression coverage in the circuit design by the test bench with a rapid expression coverage process. The rapid expression coverage process can divide an expression in the circuit design into multiple sub-expressions, and separately evaluate each of the multiple sub-expressions during simulation of the circuit design to detect coverage events for particular inputs in the sub-expressions. For example, a coverage event may occur when first operands in the corresponding sub-expressions receive an available input state, while second operands in the corresponding sub-expressions are in a non-masking state. The rapid expression coverage can generate an expression coverage metric to indicate whether expressions in the circuit design were covered by the test bench during the simulation of the circuit, for example, without having to generate truth-tables that include each possible input vector for each expression.

DESCRIPTION OF THE DRAWINGS

FIG. 3 illustrates an example of a design verification tool including a rapid expression coverage unit that may be implemented according to various embodiments of the invention.

FIGS. 4A-4F illustrate an example implementation of rapid expression coverage according to various embodiments of the invention.

FIGS. 5A-5F illustrate another example implementation of rapid expression coverage according to various embodiments of the invention.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
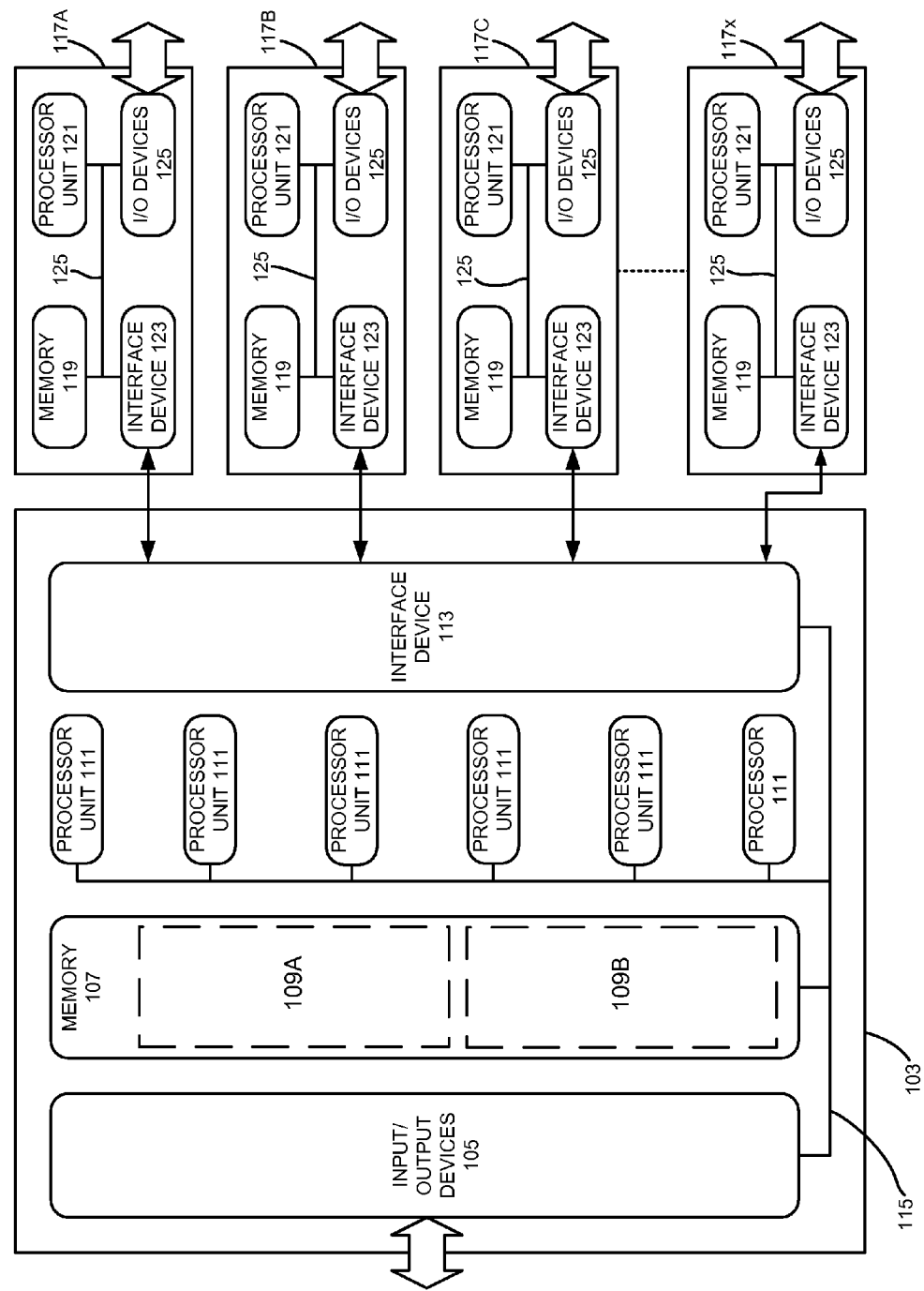
FIGS. 1 and 2 illustrate an example of a computer system of the type that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
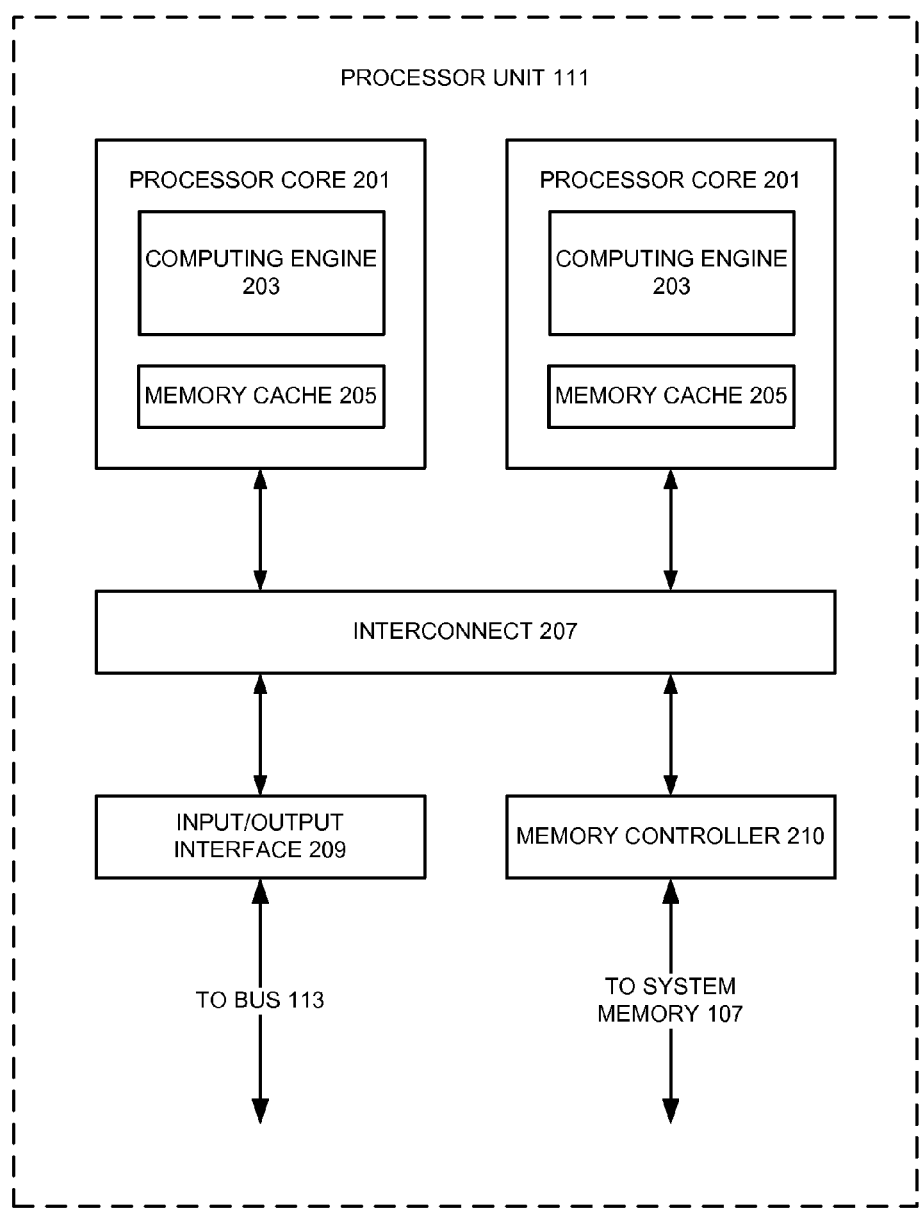

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Rapid Expression Coverage

FIG. 3 illustrates an example of a design verification tool 301 including a rapid expression coverage unit 309 that may be implemented according to various embodiments of the invention. Referring to FIG. 3, the design verification tool 301 can receive a circuit design 302, which can describe an electronic device both in terms of an exchange of data signals between components in the electronic device, such as hardware registers, flip-flops, combinational logic, or the like, and in terms of logical operations that can be performed on the data signals in the electronic device. The circuit design 302 can model the electronic device at a register transfer level (RTL), for example, with code in a hardware description language (HDL), such as Verilog, Very high speed integrated circuit Hardware Design Language (VHDL), or the like.

The design verification tool 301 can include a test generation unit 303 to generate a test bench 306 in response to test input 304. The test bench 306 can include a set of test stimuli capable of being utilized to functionally verify the circuit design 302, for example, by providing test scenarios to determine whether the circuit design 302 can function as expected. In some embodiments, the design verification tool 301 can receive the test input 304 from a source external to the design verification tool 301, such as a user interface of the computer network 101, another tool implemented by the computer network 101, or the design verification tool 301 may automatically generate the test input 304 internally. Although FIG. 3 shows the design verification tool 301 including the test generation unit 303, in some embodiments, the test generation unit 303 can be located external to the design verification tool 301.

The design verification tool 301 can include a circuit simulation unit 305 to simulate the circuit design 302 based, at least in part, on the test bench 306. The circuit simulation unit 305 can receive the test bench 306 from the test generation unit 303, which, in some embodiments, can prompt the circuit simulation unit 305 to initiate simulation of the circuit design 302. The circuit simulation unit 305 can generate a test output 308, which can correspond to a simulated output created by the circuit design 302 during simulation with the test bench 306. The design verification tool 301 (or a tool external to the design verification tool 301) can perform a functional verification of the circuit design 302, for example, by comparing the test output 308 with an expected output from the circuit design 302 in response the test bench 306.

The design verification tool 301 can include a coverage metric unit 307 to generate one or more metrics that indicate which portions of the circuit design 302 were utilized in response to the test bench 306. The coverage metric unit 307 can monitor the simulation of the circuit design 302 implementing the test bench 306, detect coverage events, such as execution of statements, expressions, decisions, conditions, etc., in the circuit design 302, and generate the one or more metrics based on the detection of coverage events. The coverage metric unit 307 can generate one or more coverage reports 310, which can include the metrics, for example, which can be utilized to determine whether the test bench 306 satisfies a predetermine specification. Although FIG. 3 shows the coverage metric unit 307 as separate from the circuit simulation unit 305, in some embodiments, the coverage metric unit 307 may be included in the circuit simulation unit 305.

The coverage metric unit 307 can include a rapid expression coverage unit 309 to determine whether the test bench 306 provides expression coverage for the circuit design 302. The rapid expression coverage unit 309 can identify one or more expressions in the code of the circuit design 302. In some embodiments, the rapid expression coverage unit 309 can receive the circuit design 302 from a user interface of the computer network 101, another tool implemented by the computer network 101, or another unit in the design verification tool 301. The rapid expression coverage unit 309 can monitor input vectors into the expressions in the circuit design 302 during simulation with the test bench 306, and generate an expression coverage metric to indicate whether the expressions were covered in response to the test bench 306.

The rapid expression coverage unit 309 can deem an expression covered when each input of the expression independently controls the output of the expression for each of their available input states. For example, when the input of the expression receives a binary value, such as for Boolean logic expressions, the expression may be deemed covered when each input of the expression controls the output of the expression in both "0" and "1" input states. In some embodiments, an input of an expression can control the output of the expression when the other inputs receive values in non-masking states. For example, in an expression (A or B), input A, when set to "0", would be in a non-masking state, as the state of input B would be able to dictate the output of the expression (A or B). Input A, when set to "1", would be in a masking state, as the output of the expression (A or B) would be "1" regardless of the state of input B.

Rather than performing conventional expression coverage utilizing truth-tables having all possible input vectors for each expression in the circuit design 302, the rapid expression coverage unit 309 can perform expression coverage by dividing an expression in the circuit design 302 into sub-expressions and separately evaluating the sub-expressions to detect expression coverage events produced by the test bench 306.

The rapid expression coverage unit 309 can include a partitioning unit 311 to divide expressions identified in the circuit design 302 into multiple sub-expressions, each including an input of the expression to be evaluated for expression coverage. Some of the sub-expressions can include a logical operator from the expression, such as an AND operator, a NAND operator, an OR operator, a NOR operator, an XOR operator, an XNOR operator, a NOT operator, a TERNARY operator, or the like. These sub-expressions can include a first operand corresponding to the input of the expression to be evaluated for expression coverage, and optionally include a second operand corresponding to a different one of the sub-expressions or another one of the inputs of the expression. In some embodiments, the sub-expressions can be arranged or nested from left-to-right, with the second operands in the sub-expressions including those portions of the expression falling sequentially after the logical operators in the corresponding sub-expressions. Embodiments of the division of the expressions into sub-expressions will be described below in greater detail.

The rapid expression coverage unit 309 can include a coverage detection unit 313 to determine non-masking states for the second operands, for example, based on the logical operators in those sub-expressions. The coverage detection unit 313 can monitor input vectors received by each sub-expression during simulation of the circuit design 302 with the test bench 306 to determine whether the second operand enters a non-masking state. When the first operand receives values for each input state, while the second operand is in a non-masking state, the coverage detection unit 313 can deem the input corresponding to the first operand covered. The coverage detection unit 313 can determine that the entire expression is covered when each of the individual inputs are covered through the evaluation of the individual sub-expressions.

The rapid expression coverage unit 309 can include a recording unit 315 to receive indications from the coverage detection unit 313 when one or more of the input states of an input in an expression have been deemed covered. The recording unit 315 can store each of these indications to a memory device or memory system for subsequent use, for example, in generating a coverage report 310.

The rapid expression coverage unit 309 can include a metric reporting unit 317 to generate a coverage report 310 to convey how well the test bench 306 came to covering the expressions in the circuit design 302. In some embodiments, the coverage report 310 can include an expression coverage metric, for example, generated by the metric reporting unit 317 based on the indications from the coverage detection unit 313 or stored in the memory device or memory system. The expression coverage metric can be a percentage of expressions in the circuit design 302 that were completely and/or partially covered during simulation with the test bench 306, a percentage of sub-expressions that were completely and/or partially covered in the circuit design 302 during simulation with the test bench 306, or any other metric that attempts to convey how well the test bench 306 came to covering the expressions in the circuit design 302. In some embodiments, the coverage report 310 can include information on which specific inputs to an expression were covered and for which input states.

FIGS. 4A-4F illustrate an example implementation of rapid expression coverage according to various embodiments of the invention. Referring to FIGS. 4A-4D, an expression, A && B && C && D, is shown graphically in an expression tree 400 having four inputs 404, 414, 424, and 434 corresponding to inputs A-D, respectively, and three logical operators 402, 412, and 422 corresponding to the AND operators in the expression. Although FIG. 4A shows the expression tree 400 arranging the expression from left-to-right, with a leftmost logical operator 402 in the expression being utilized as a root node of the expression tree 400, in some embodiments, the expression can be arranged right-to-left or another different format.

During rapid expression coverage, the expression can be divided into multiple sub-expressions, each including a coverage operand corresponding to different ones of the four inputs 404, 414, 424, and 434. The sub-expressions can be utilized during rapid expression coverage to determine coverage for individual inputs corresponding to the coverage operands, which can indicate whether the expression is at least partially covered by the test bench 306 during simulation of the circuit design 302.

A first sub-expression 401 can include a logical operator 402 to perform a logical AND operation on a first operand corresponding to a first input 404 of the expression and a second operand corresponding to a portion of the expression sequentially after the logical operator 402. The second operand in the first sub-expression 401 can correspond to a second sub-expression 410.

The second sub-expression 410 can include a logical operator 412 to perform a logical AND operation on a first operand corresponding to a second input 414 of the expression and a second operand corresponding to a portion of the expression sequentially after the logical operator 412. The second operand in the second sub-expression 410 can correspond to a third sub-expression 420.

The third sub-expression 420 can include a logical operator 422 to perform a logical AND operation on a first operand corresponding to a third input 424 of the expression and a second operand corresponding to a portion of the expression sequentially after the logical operator 422. The second operand in the third sub-expression 420 can correspond to a fourth sub-expression 430, which can include a single operand corresponding to a fourth input 434 of the expression.

Referring to FIGS. 4E and 4F, tables show coverage conditions for inputs 404, 414, 424, and 434 in the corresponding sub-expressions 401, 410, 420, and 430. During rapid expression coverage, the sub-expressions 401, 410, 420, and 430 can be separately evaluated to determine whether they receive values from input vectors that cover their corresponding inputs 404, 414, 424, and 434. For example, in the first sub-expression 401, when the first operand receives values corresponding to each input state, while the second operand is in a non-masking state, the input A in the first sub-expression 401, can be deemed covered. The tables show that the non-masking state for the second operand can correspond to when B && (C && D)=1, or when inputs 414, 424, and 434 each receive an input state of "1". The non-masking state for the second operand can be determined based, at least in part, on the logical operator in the corresponding sub expression. For example, since the first sub-expression 401 includes a logical operator 402 to perform a logical AND operation, the non-masking state for the second operand would be when the second operand is equal to "1". Table 1 shows a list of non-masking states for different logical operators.

TABLE 1

| OPERATOR | EXPRESSION | NON-MASKING STATE |
| --- | --- | --- |
| OR | A OR B | B = 0 |
| NOR | A NOR B | B = 0 |
| AND | A AND B | B = 1 |
| NAND | A NAND B | B = 1 |
| XOR | A XOR B | B = 0 OR 1 |
|  |  | (FOR BOTH STATES OF A) |
| XNOR | A XNOR B | B = 0 OR 1 |
|  |  | (FOR BOTH STATES OF A) |
| TERNARY | IF (COND), THEN A; OTHERWISE B | COND = 1, B IS NON-MASKING |
|  | IF (COND), THEN B; OTHERWISE A | COND = 0, B IS NON-MASKING |
| NOT | NOT A | N/A |

In the second sub-expression 410, when the first operand receives values corresponding to each input state, while the second operand is in a non-masking state, the input B in the second sub-expression 410, can be deemed covered. The tables show that the non-masking state for the second operand can correspond to when C && D=1, or when inputs 424 and 434 each receive an input state of "1".

In the third sub-expression 420, when the first operand receives values corresponding to each input state, while the second operand is in a non-masking state, the input C in the third sub-expression 420, can be deemed covered. The tables show that the non-masking state for the second operand can correspond to when D=1, or when input 434 receives an input state of "1".

In the fourth sub-expression 430, when the first operand receives values corresponding to each input state, the input D in the fourth sub-expression 430 can be deemed covered.

As shown above in the evaluation of sub-expressions 410, 420, and 430, the inputs to the left of the logical operator in the sub-expression under evaluation were ignored during rapid expression coverage. This may be allowed when the logical operators in the sub-expressions 401, 410, 420, and 430 correspond to short-circuiting operators, as expressions with the short-circuiting operators are executed sequentially. In other words, when the expression includes a short-circuiting operator, any inputs corresponding to previously-executed short-circuiting logical operators in the expression can be ignored when evaluating a sub-expression, as the inputs corresponding to the previously-executed short-circuiting logical operators can be deemed not to be in a masking state. Further, when an input being evaluated in a sub-expression having a short-circuiting operator, the inputs sequentially after or to the right of the short-circuiting operator can be ignored when the input being evaluated is in a masking state. For example, in the first sub-expression 401, when input A receives an input state of "0", which is masking to the logical operator of the first sub-expression 401, the input A can be deemed covered without regard to the other inputs B-D.

When the logical operators in the sub-expressions 401, 410, 420, and 430 correspond to non-short-circuiting operators—meaning the logical operations can be performed in an at least partially overlapping fashion—the inputs to the left of the non-short-circuiting operators in sub-expressions under evaluation can be evaluated during rapid expression coverage to determine whether they are in a non-masking state. In some embodiments, a flag can be set to indicate when the inputs to the left of the non-short-circuiting operators in sub-expressions under evaluation are in a non-masking state. In some embodiments, all of the inputs can be collected to determine expression coverage during rapid coverage expression without utilizing a flag.

During rapid expression coverage, therefore, the type of logical operators present in the expression, i.e., short-circuiting logical operators or non-short-circuiting logical operators, can be determined. When the expression includes non-short-circuiting logical operators, the flag can be set based on a state of inputs located to the left of the logical operation under evaluation and coverage of the expression can be based on whether the first operand in a sub-expression receives a value, whether the second operand in the sub-expression is in a non-masking state, and the state of the flag. In some embodiments, when the expression includes non-short-circuiting logical operators, states of the inputs in the expression under evaluation can be captured and then utilized to determine coverage of the expression without utilizing a flag.

Figure 5A:
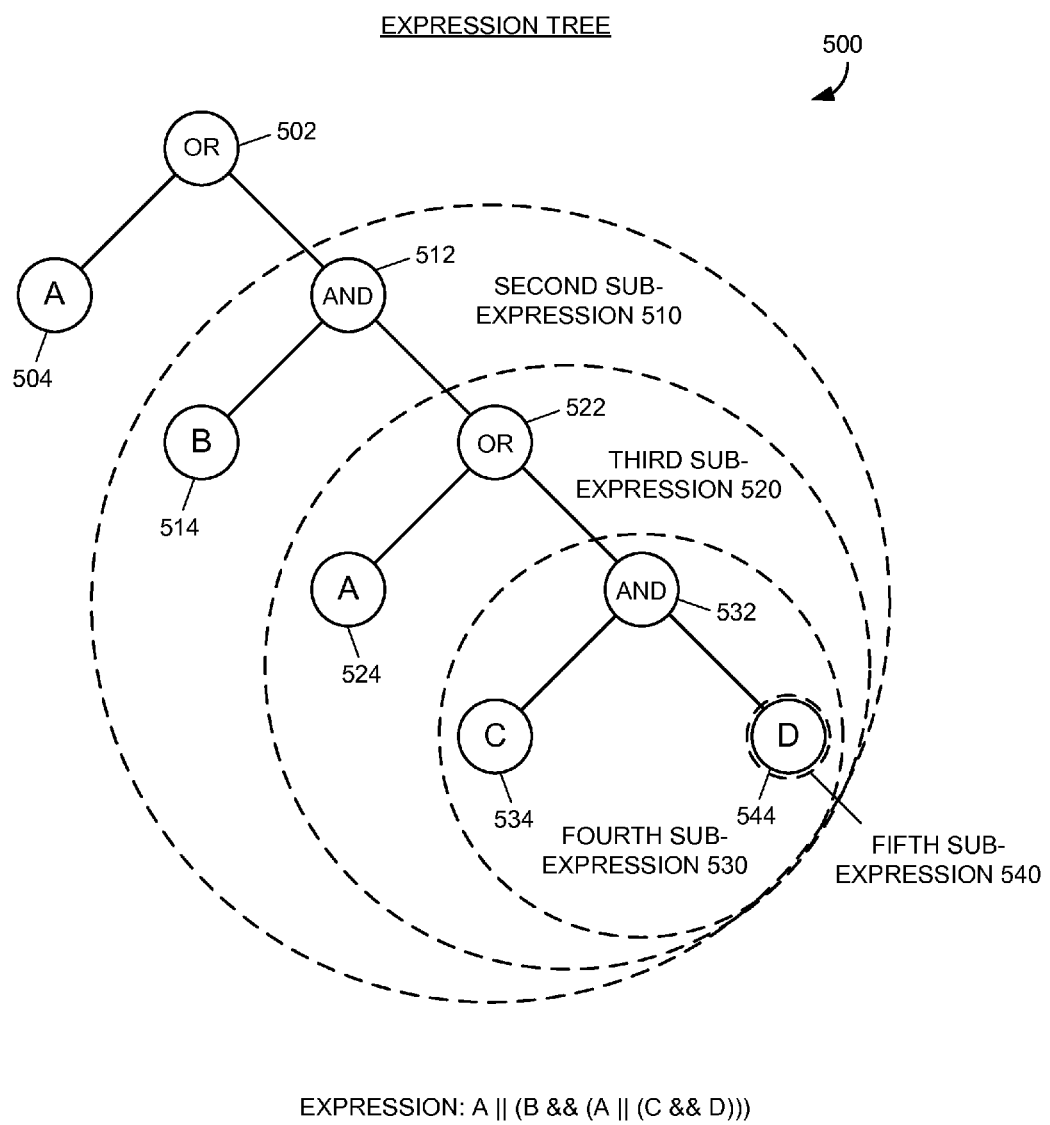

FIGS. 5A-5F illustrate another example implementation of rapid expression coverage according to various embodiments of the invention. Referring the FIGS. 5A-5E, an expression, A||(B && (A||(C && D))), is shown graphically in an expression tree 500 having five inputs 504, 514, 524, 534, and 544 and four logical operators 502, 512, 522, and 532 corresponding to the AND and OR operators in the expression. Although FIG. 5A shows the expression tree 500 arranging the expression from left-to-right, with a left-most logical operator 502 in the expression being utilized as a root node of the expression tree 500, in some embodiments, the expression can be arranged right-to-left or another different format.

During rapid expression coverage, the expression can be divided into multiple sub-expressions, each including a coverage operand corresponding to different ones of the five inputs 504, 514, 524, 534, and 544. The sub-expressions can be utilized during rapid expression coverage to determine coverage for individual inputs corresponding to the coverage operands, which can indicate whether the expression is at least partially covered by the test bench 306 during simulation of the circuit design 302.

A first sub-expression 501 can include a logical operator 502 to perform a logical OR operation on a first operand corresponding to a first input 504 of the expression and a second operand corresponding to a portion of the expression sequentially after the logical operator 502. The second operand in the first sub-expression 501 can correspond to a second sub-expression 510.

The second sub-expression 510 can include a logical operator 512 to perform a logical AND operation on a first operand corresponding to a second input 514 of the expression and a second operand corresponding to a portion of the expression sequentially after the logical operator 512. The second operand in the second sub-expression 510 can correspond to a third sub-expression 520.

The third sub-expression 520 can include a logical operator 522 to perform a logical OR operation on a first operand corresponding to a third input 524 of the expression and a second operand corresponding to a portion of the expression sequentially after the logical operator 522. The second operand in the third sub-expression 520 can correspond to a fourth sub-expression 530.

The fourth sub-expression 530 can include a logical operator 532 to perform a logical AND operation on a first operand corresponding to a fourth input 534 of the expression and a second operand corresponding to a portion of the expression sequentially after the logical operator 532. The second operand in the fourth sub-expression 530 can correspond to a fifth sub-expression 540, which can include a single operand corresponding to a fifth input 544 of the expression.

Referring to FIG. 5F, a table shows coverage conditions for inputs 504, 514, 524, 534, and 544 in the corresponding sub-expressions 501, 510, 520, 530, and 540. During rapid expression coverage, the sub-expressions 501, 510, 520, 530, and 540 can be separately evaluated to determine whether they receive values from input vectors that cover their corresponding puts 504, 514, 524, 534, and 544. For example, in the first sub-expression 501, when the first operand receives values corresponding to each input state, while the second operand is in a non-masking state, the input A in the first sub-expression 501, can be deemed covered. The table shows that the non-masking state for the second operand can correspond to when B && (A||(C && D))=0.

In the second sub-expression 510, when the first operand receives values corresponding to each input state, while the second operand is in a non-masking state, the input B in the second sub-expression 510 can be deemed covered. The table shows that the non-masking state for the second operand can correspond to when A||(C && D)=1. When the logical operators in the expression are non-short-circuiting, the coverage of input B in the second sub-expression 510 can also be based on the value of previous input, namely, a flag being set when input A receives a "0" value.

In the third sub-expression 520, when the first operand receives values corresponding to each input state, while the second operand is in a non-masking state, the second instance of input A in the third sub-expression 520 can be deemed covered. Since input A is duplicated in this expression, and thus in a non-masking state of "0" for any of the subsequent inputs to be covered, this second instance of input A cannot be fully covered, as it cannot receive an input state of "1" and control the output of the expression.

The second instance of input A not being able to receive the input state of "1" and control the output of the expression, however, does not necessarily mean that input A itself cannot be deemed fully covered during the rapid expression coverage. In some embodiments, the rapid expression coverage can implement different coverage detection schemes for duplicated inputs. The rapid expression coverage can implement a "relaxed" duplicate input coverage scheme, which can deem an input covered when at least one of the duplicated inputs controls the output when receiving a "0" and when receiving a "1". For example, an input can be deemed covered under "relaxed" duplicate input coverage during rapid expression coverage when a first instance of the input can control the output while receiving a "0", and a second instance of the input can control the output while receiving a "1".

The rapid expression coverage can implement a "strict" duplicate input coverage scheme, which can deem an input covered when all the duplicated inputs simultaneously control the output when receiving a "0" and when receiving a "1". The rapid expression coverage can implement a "balanced" duplicate input coverage scheme, which can deem an input covered when all the duplicated inputs individually control the output when receiving a "0" and when receiving a "1", but the inputs do not have to necessarily control the output simultaneously in order to be deemed covered. The rapid expression coverage can implement a "relaxed balanced" duplicate input coverage scheme, which can deem an input covered when any one of the duplicated inputs controls the output when receiving a "0" and when receiving a "1". Thus, in the example shown in FIGS. 5A-5F, the input A can be deemed covered when the rapid expression coverage implements a "relaxed" or "relaxed balanced" duplicate input coverage schemes, but, due to the inability of the second instance of input A to receive an input of "1", would deemed the input A uncovered when the rapid expression coverage implements a "strict" or "balanced" duplicate input coverage schemes.

In the fourth sub-expression 530, when the first operand receives values corresponding to each input state, while the second operand is in a non-masking state, the input C in the second sub-expression 530 can be deemed covered. The table shows that the non-masking state for the second operand can correspond to when D=1. When the logical operators in the expression are non-short-circuiting, the coverage of input C in the fourth sub-expression 530 can also be based on the value of previous input, namely, a flag being set when input A receives a "0" value and input B receives a "1" value.

In the fifth sub-expression 540, when the first operand receives values corresponding to each input state, the input D in the fifth sub-expression 540 can be deemed covered. When the logical operators in the expression are non-short-circuiting, the coverage of input C in the fourth sub-expression 530 can also be based on the value of previous input, namely, a flag being set when input A receives a "0" value and inputs B and C receives a "1" value.

Figure 6:
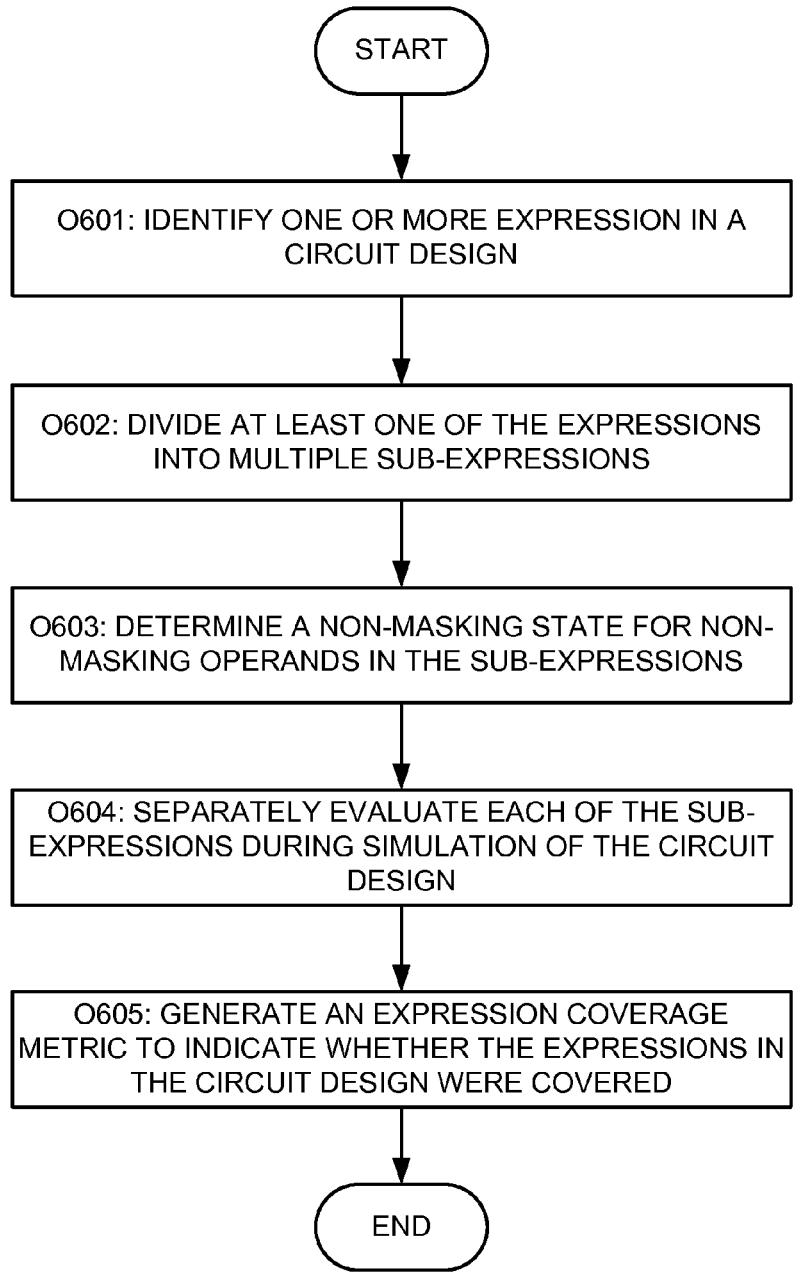
FIG. 6 illustrates a flowchart showing an example implementation of rapid expression coverage according to various examples of the invention.

FIG. 6 illustrates a flowchart showing an example implementation of rapid expression coverage according to various examples of the invention. Referring to FIG. 6, in a block 601, one or more expression in a circuit design can be identified. In a block 602, at least one of the expressions can be divided into multiple sub-expressions. The design verification tool 301 can divide expressions identified in the circuit design 302 into multiple sub-expressions, each including an input of the expression to be evaluated for expression coverage. Some of the sub-expressions can include a logical operator from the expression, such as an AND operator, a NAND operator, an OR operator, a NOR operator, an XOR operator, an XNOR operator, a NOT operator, a TERNARY operator, or the like. These sub-expressions can include a coverage operand corresponding to the input of the expression to be evaluated for expression coverage, and optionally include a non-masking operand corresponding to a different one of the sub-expressions or another one of the inputs of the expression. In some embodiments, the sub-expressions can be arranged or nested from left-to-right, with the non-masking operands in the sub-expressions including those portions of the expression falling sequentially after the logical operators in the corresponding sub-expressions.

In a block 603, a non-masking state for non-masking operands in the sub-expressions can be determined. The design verification tool 301 can determine non-masking states for the second operands, for example, based on the logical operators in those sub-expressions.

In a block 604, each of the sub-expressions can be separately evaluated during simulation of the circuit design. The design verification tool 301 can monitor input vectors received by each sub-expression during simulation of the circuit design with a test bench to determine whether the non-masking operand enters a non-masking state. When the design verification tool 301 detects the coverage operand receive values for each available input state, while the non-masking operands are in a non-masking state, the design verification tool 301 can deem the input corresponding to the coverage operand covered.

In some embodiments, the design verification tool 301 can store detected expression coverage events and store them in a memory device or memory system for subsequent use, for example, in generating a coverage report 310. The design verification tool 301 can determine that the entire expression is covered when each of the individual inputs are covered through the evaluation of the individual sub-expressions, which, in some embodiments, can be performed by reviewing the coverage events stored in the memory device or memory system.

In a block 605, an expression coverage metric can be generated to indicate whether the expressions in the circuit design were covered. The design verification tool 301 can generate a coverage report to convey how well the test bench came to covering the expressions in the circuit design. In some embodiments, the coverage report can include an expression coverage metric, for example, a percentage of expressions in the circuit design that were completely and/or partially covered during simulation with the test bench, a percentage of sub-expressions that were completely and/or partially covered in the circuit design during simulation with the test bench, or any other metric that attempts to convey how well the test bench 306 came to covering the expressions in the circuit design. In some embodiments, the coverage report can include information on which specific inputs to an expression were covered and for which input states.

Although FIGS. 3-6 disclose rapid expression coverage for functional coverage in electronic design automation (EDA), the rapid expression coverage can be utilized in any number of other fields include software fields, for example, written in C code and Java code, or in hardware fields, such as circuit emulation, or the like.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    dividing, by a computing system, an expression in a circuit design into multiple sub-expressions; and
    separately evaluating, by the computing system, each of the multiple sub-expressions during simulation of the circuit design to detect whether first operands in the corresponding sub-expressions receive each available input state, while second operands in the corresponding sub-expressions are in a non-masking state, wherein the second operands in the corresponding sub-expressions include portions of the expression falling sequentially after the logical operators in the corresponding sub-expressions.

2. The method of claim 1, further comprising generating, by the computing system, an expression coverage metric based on the detection, wherein the expression coverage metric is configured to indicate whether one or more expressions in the circuit design were covered during the simulation of the circuit.

3. The method of claim 2, wherein the expression coverage metric is a percentage of sub-expressions having first operands that receive each available input state, while the second operands are in the non-masking state.

4. The method of claim 1, further comprising determining, by the computing system, the non-masking state for the second operands in the corresponding sub-expressions based, at least in part, on logical operators the corresponding sub-expressions.

5. The method of claim 1, further comprising recording, by the computing system, an entry in a memory device during the simulation of the circuit design when the first operands in corresponding sub-expressions receive each available input state, while the second operands in the corresponding sub-expressions are in the non-masking state.

6. The method of claim 1, further comprising:
   setting, by the computing system, a flag when the expression includes a non-short-circuiting operator and a portion of the expression previously executed relative to the non-short-circuiting operator is non-masking; and
   recording, by the computing system, an entry in a memory device during the simulation of the circuit design when the flag is set and the first operands in the corresponding sub-expressions receive each available input state, while second operands in the corresponding sub-expressions are in a non-masking state.

7. The method of claim 1, wherein at least one of the sub-expressions is nested in the second operand of another one of the sub-expressions.

8. A system comprising:
   an expression partitioning unit configured to divide an expression in a circuit design into multiple sub-expressions; and
   a coverage detection unit configured to separately evaluate each of the multiple sub-expressions during simulation of the circuit design to detect whether first operands in the corresponding sub-expressions receive each available input state, while second operands in the corresponding sub-expressions are in a non-masking state, wherein the coverage detection unit is configured to determine the non-masking state for the second operands in the corresponding sub-expressions based, at least in part, on logical operators the corresponding sub-expressions.

9. The system of claim 8, further comprising a reporting unit configured to generate an expression coverage metric based on the detection, wherein the expression coverage metric is configured to indicate whether one or more expressions in the circuit design were covered during the simulation of the circuit.

10. The system of claim 9, wherein the expression coverage metric is a percentage of sub-expressions having first operands that receive each available input state, while the second operands are in the non-masking state.

11. The system of claim 8, wherein the second operands in the corresponding sub-expressions include portions of the expression falling sequentially after the logical operators in the corresponding sub-expressions.

12. The system of claim 8, further comprising a recording unit is configured to store an entry in a memory device during the simulation of the circuit design when the first operands in corresponding sub-expressions receive each available input state, while the second operands in the corresponding sub-expressions are in the non-masking state.

13. The system of claim 12, wherein the coverage detection unit is configured to set a flag when the expression includes a non-short-circuiting operator and a portion of the expression previously executed relative to the non-short-circuiting operator is non-masking, and wherein the recording unit is configured to store the entry in the memory device when the flag is set.

14. The system of claim 8, wherein at least one of the sub-expressions is nested in the second operand of another one of the sub-expressions.

15. An apparatus comprising at least one computer-readable memory device storing instructions configured to cause one or more processing devices to perform operations comprising:
   simulating a circuit design with a test bench;
   dividing expressions into multiple sub-expressions;
   separately evaluating each of the multiple sub-expressions during the simulation of the circuit design to detect whether first operands in the corresponding sub-expressions receive each available input state, while second operands in the corresponding sub-expressions are in a non-masking state; and
   generating an expression coverage metric configured to indicate whether the expressions in the circuit design were covered by the test bench during the simulation of the circuit design without generating truth-tables that include each possible input vector for each expression.

16. The apparatus of claim 15, wherein the expression coverage metric corresponds to a percentage of sub-expressions having first operands that receive each available input state, while the second operands are in the non-masking state.

17. The apparatus of claim 15, wherein the instructions are configured to cause one or more processing devices to perform operations further comprising determining the non-masking state for the second operands in the corresponding sub-expressions based, at least in part, on logical operators the corresponding sub-expressions.

18. The apparatus of claim 15, wherein the second operands in the corresponding sub-expressions include portions of the expression falling sequentially after the logical operators in the corresponding sub-expressions.

19. The apparatus of claim 15, wherein the instructions are configured to cause one or more processing devices to perform operations further comprising recording an entry in a storage device during the simulation of the circuit design when the first operands in corresponding sub-expressions receive each available input state, while the second operands in the corresponding sub-expressions are in the non-masking state.

20. The apparatus of claim 15, wherein at least one of the sub-expressions is nested in the second operand of another one of the sub-expressions.

* * * * *